United States Patent
Pan et al.

(10) Patent No.: US 10,866,031 B2
(45) Date of Patent: Dec. 15, 2020

(54) WATER-COOLED HEAT DISSIPATING DEVICE

(71) Applicant: KUAN DING INDUSTRIAL CO., LTD., New Taipei (TW)

(72) Inventors: Kuan-Da Pan, New Taipei (TW); Neng-Chao Chang, New Taipei (TW); Ming-Cheng Peng, New Taipei (TW); Pei-Ching Chao, New Taipei (TW)

(73) Assignee: KUAN DING INDUSTRIAL CO., LTD., New Taipei (TW)

( * ) Notice: Subject to any disclaimer, the term of this patent is extended or adjusted under 35 U.S.C. 154(b) by 28 days.

(21) Appl. No.: 16/359,316

(22) Filed: Mar. 20, 2019

(65) Prior Publication Data

US 2020/0173728 A1  Jun. 4, 2020

(30) Foreign Application Priority Data

Nov. 30, 2018  (TW) .............................. 107216367 U

(51) Int. Cl.
| F28D 15/02 | (2006.01) |
| F28F 13/06 | (2006.01) |
| F28D 15/00 | (2006.01) |
| F28F 13/12 | (2006.01) |
| H01L 23/473 | (2006.01) |

(52) U.S. Cl.
CPC .......... F28D 15/0233 (2013.01); F28F 13/06 (2013.01); F28D 15/00 (2013.01); F28F 13/12 (2013.01); H01L 23/473 (2013.01)

(58) Field of Classification Search
CPC ...... F28D 15/0233; F28D 15/00; F28F 13/06; F28F 13/12; H01L 23/473; H01L 29/007
USPC ........................................... 165/80.4, 104.33
See application file for complete search history.

(56) References Cited

U.S. PATENT DOCUMENTS

| 9,976,812 B2 * | 5/2018 | Holahan ............... F04D 13/024 |
| 2018/0023594 A1 * | 1/2018 | Sheng ...................... F04D 1/06 |
| | | 165/104.31 |
| 2018/0340541 A1 * | 11/2018 | Nuhn ...................... F04D 13/02 |

* cited by examiner

Primary Examiner — Joel M Attey
(74) Attorney, Agent, or Firm — Chun-Ming Shih; HDLS IPR Services

(57) ABSTRACT

A liquid cooling device includes a base (1), a passive impeller (3) and a cold plate (4). The base (1) includes a division plate (11), a chamber (12) and a flow guiding pole (13). The division plate (11) divides the chamber (12) into a catchment portion and a heat exchanging portion (17). The flow guiding pole (13) communicates with both the catchment portion (16) and the heat exchanging portion (17). The passive impeller (3) is received in the chamber (12) and radially driven to rotate by the working fluid. The cold plate (4) is arranged correspondingly to the heat exchanging portion (17) and fastened to the base (1).

10 Claims, 6 Drawing Sheets

WATER-COOLED HEAT DISSIPATING DEVICE

BACKGROUND OF THE INVENTION

Technical Field

The invention relates to heat dissipating devices, particularly to liquid-cooled heat dissipating devices.

Related Art

A currently available water (liquid) cooling system includes a water tank, a water block attached on a heating element, a water pump connected to the water tank, a water-to-air heat exchanger, coolant and pipes for rapidly dissipating heat form the heating element. In comparison with air cooling, water cooling has advantages of higher heat dissipation efficiency, lower noise and colorful visual effect, so it has been widely applied in personal computers. When the coolant evaporates or is consumed or leaked, the coolant will be insufficient to cause damage or life shortening of the heating element.

To solve the above problem, some manufacturers install an impeller in the water block to indicate whether the coolant is sufficient or not. Stopping rotating of the impeller means coolant is needed to be supplemented. However, existing impellers are easy to stop rotating because of a water flow direction or excessively large volume of the chamber in the water block. This makes the impeller be not able to perform its function.

SUMMARY OF THE INVENTION

An object of the invention is to provide a water-cooled heat dissipating device, which reduces volume of the chamber to conduce to driving the passive impeller to rotate so that sufficiency of the coolant can be reliably monitored.

To accomplish the above object, the invention provides a water-cooled heat dissipating device, which includes a base, a passive impeller and a cold plate. The base includes a division plate, a chamber and a flow guiding pole. The division plate divides the chamber into a catchment portion and a heat exchanging portion. The flow guiding pole communicates with both the catchment portion and the heat exchanging portion. The passive impeller is received in the chamber and radially driven to rotate by the working fluid. The cold plate is arranged correspondingly to the heat exchanging portion and fastened to the base.

In an embodiment, the catchment tank has two first slant plates corresponding to the water intake. Each first slant plate aslant connects to a wall of the catchment tank. The base has two second slant plates separately corresponding to the first slant plates. When the working fluid flows into the catchment tank along directions of the first slant plates to drive the passive impeller in a direction perpendicular to each blade 31 (i.e. a radial direction) to rotate.

The invention further has the following function. The catchment tank is less than the chamber in volume and the passive impeller is received in the catchment tank, so the passive impeller can be easily driven to rotate by a small flow force. As a result, a user can timely supplement the working fluid when the passive impeller stops rotating.

In addition, both the first slant plates of the catchment tank and the blocking plates of the passive impeller makes the passive impeller be easily driven to rotate by a small flow force.

That is, the passive impeller does not tend to stop rotating.

DETAILED DESCRIPTION OF THE INVENTION

Figure 1:
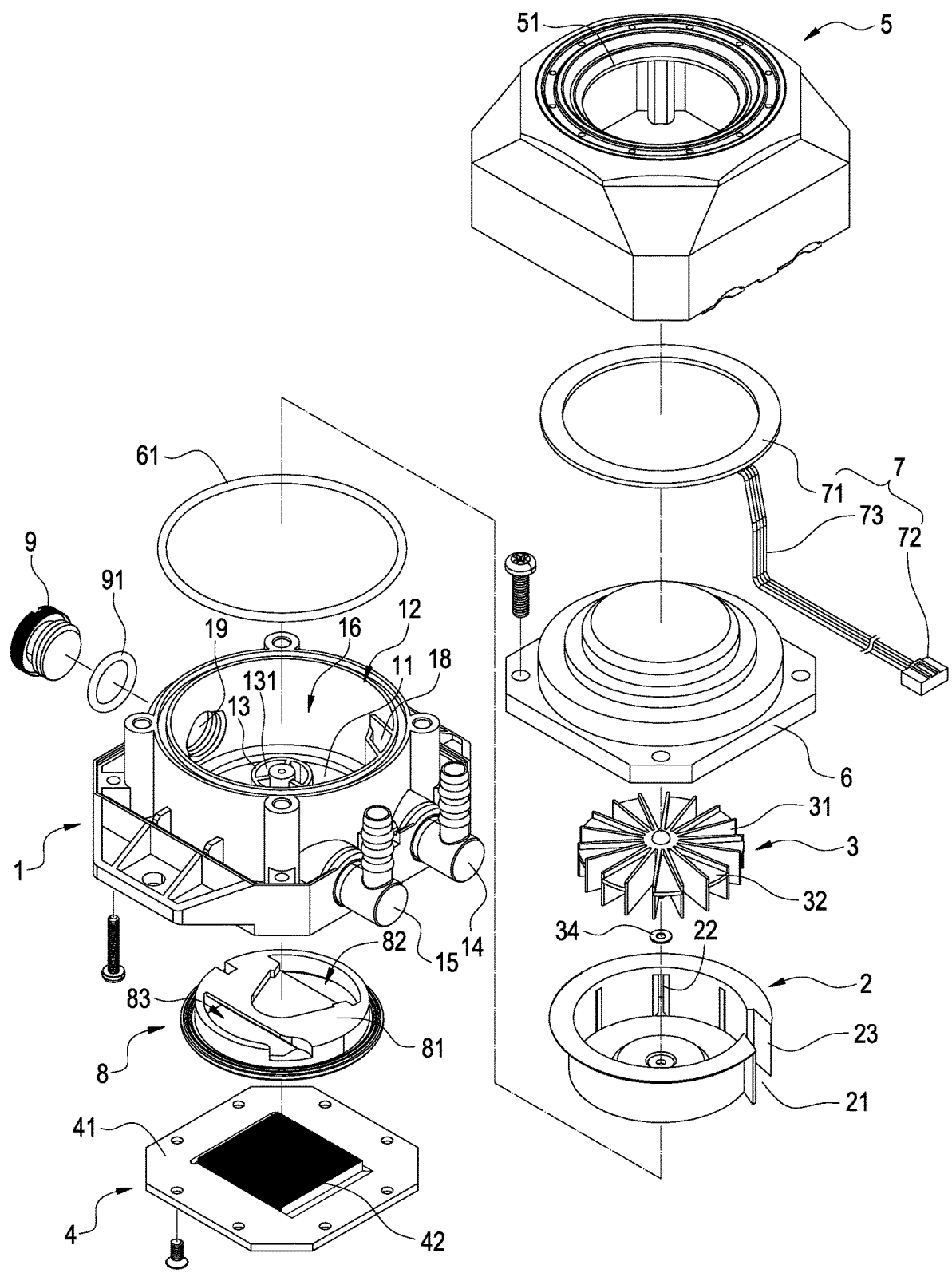
FIG. 1 is an exploded view of the water-cooled heat dissipating device of the invention.

As shown in FIGS. 1-6, the invention provides a water-cooled heat dissipating device for conveying a working fluid (not shown). The, working fluid (i.e. coolant) possesses functions of antifreeze, anti-rust and anti-corrosion and can be added with colored pigment to perform personal style or visual effect. The water-cooled heat dissipating device mainly includes a base 1, a passive impeller 3 and a cold plate 4. The water-cooled heat dissipating device mainly of the embodiment further includes a catchment tank 2, a top cover 5 assembled on the base 1, a transparent cover plate 6 disposed between the base 1 and the top cover 5, a lighting module 7 disposed between the top cover 5 and the transparent cover plate 6 and a water-resistant O-ring 61 disposed between the base 1 and the transparent cover plate 6. The top cover 6 is formed with a concave opening 51 for exposing part of the transparent cover plate 6.

The base 1 includes a division plate 11, a chamber 12, a flow guiding pole 13 vertically connected to the division plate 11 and projecting from the chamber 12, and both a water inlet 14 and a water outlet 15, which connect to a side of the base 1. The division plate 11 divides the chamber 12 into a catchment portion 16 and a heat exchanging portion 17. The flow guiding pole 13 communicates with both the catchment portion 16 and the heat exchanging portion 17. The catchment tank 2 is received in the chamber 12 and fixed on the flow guiding pole 13. The catchment tank 2 is formed with both a water intake 21 corresponding to the water inlet 14 and a water outtake 22 communicating with the catchment portion 16.

Figure 2:
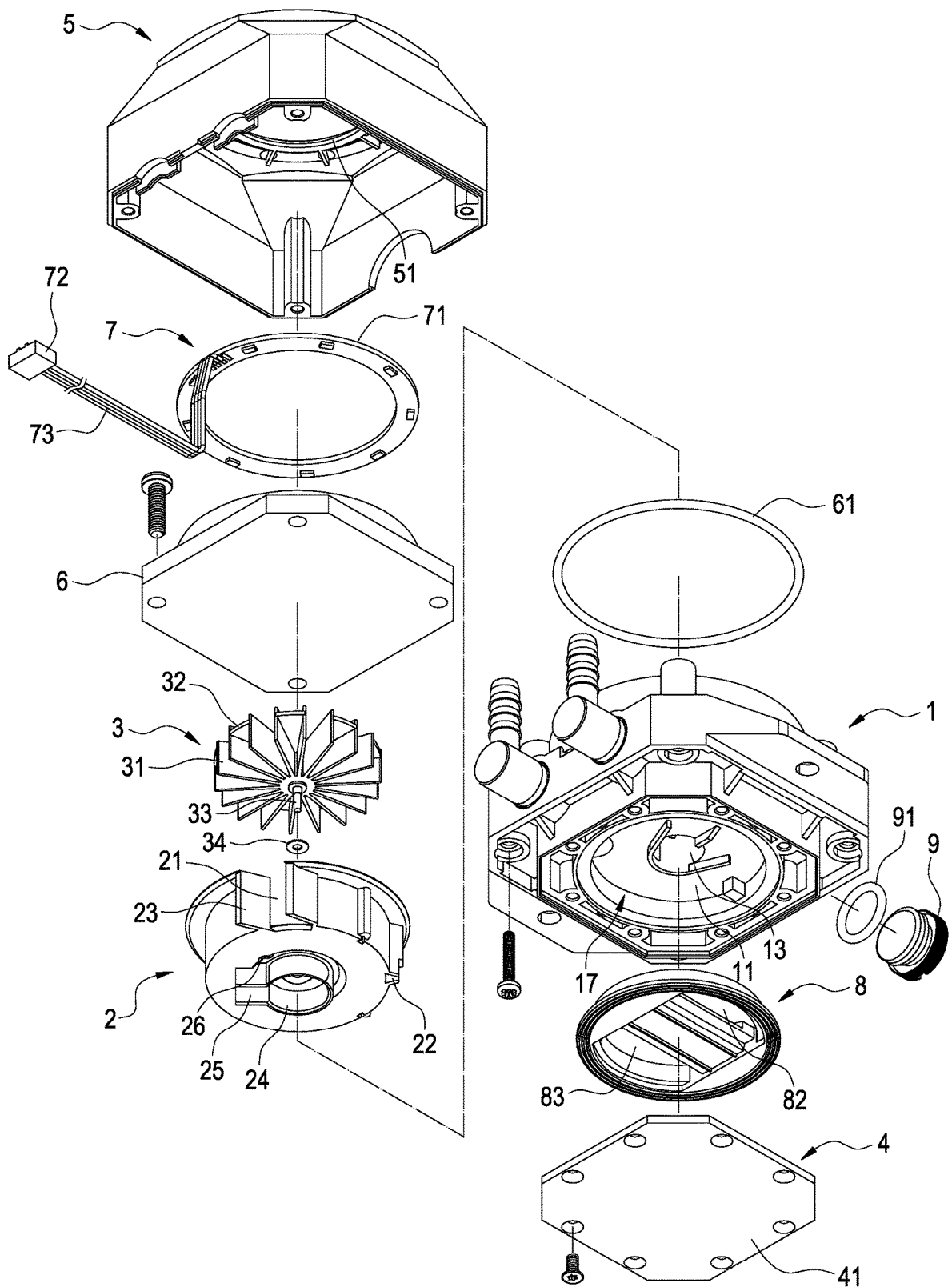
FIG. 2 is another exploded view of the water-cooled heat dissipating device of the invention.
Figure 3:
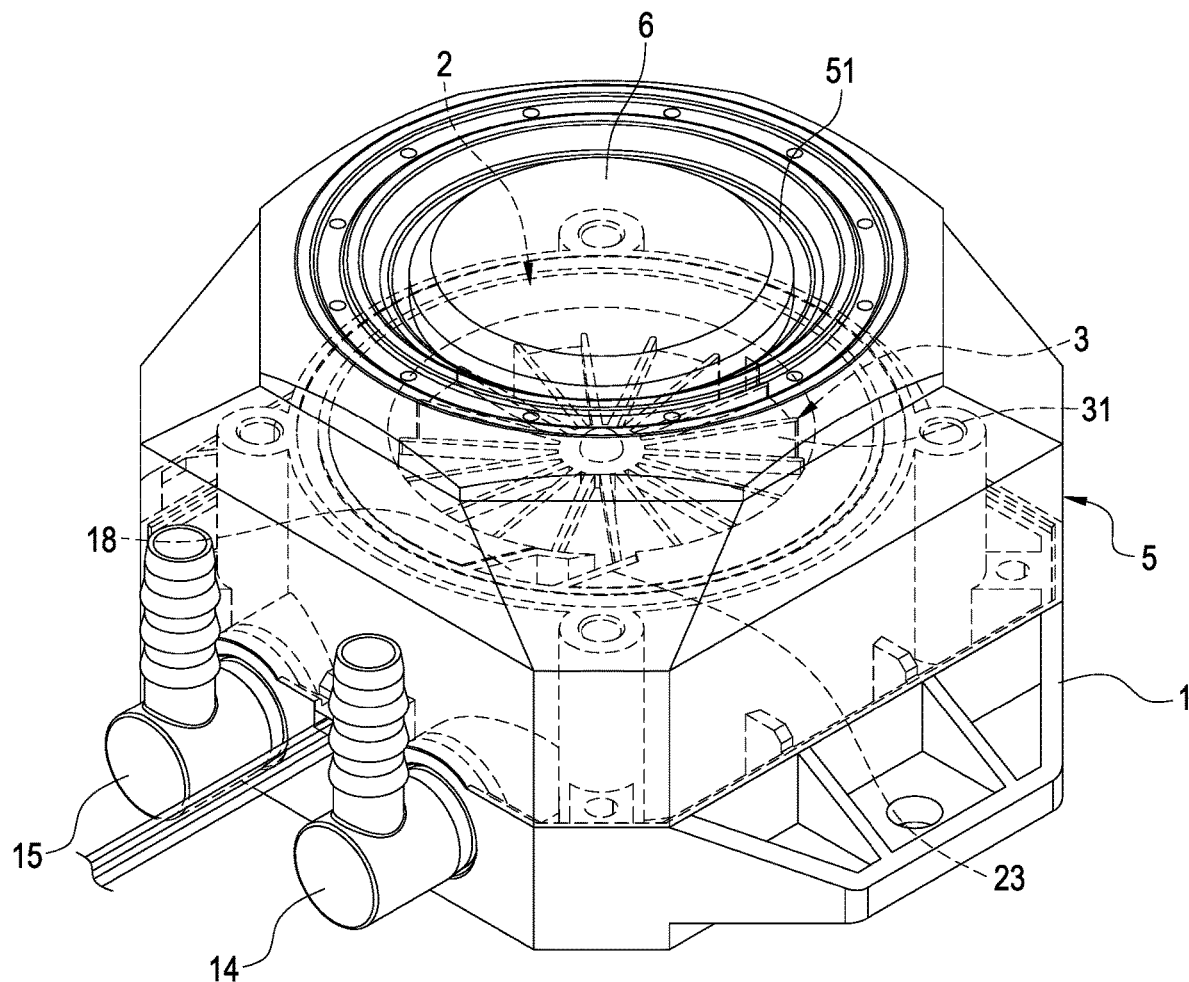
FIG. 3 is an assembled view of the water-cooled heat dissipating device of the invention.
Figure 4:
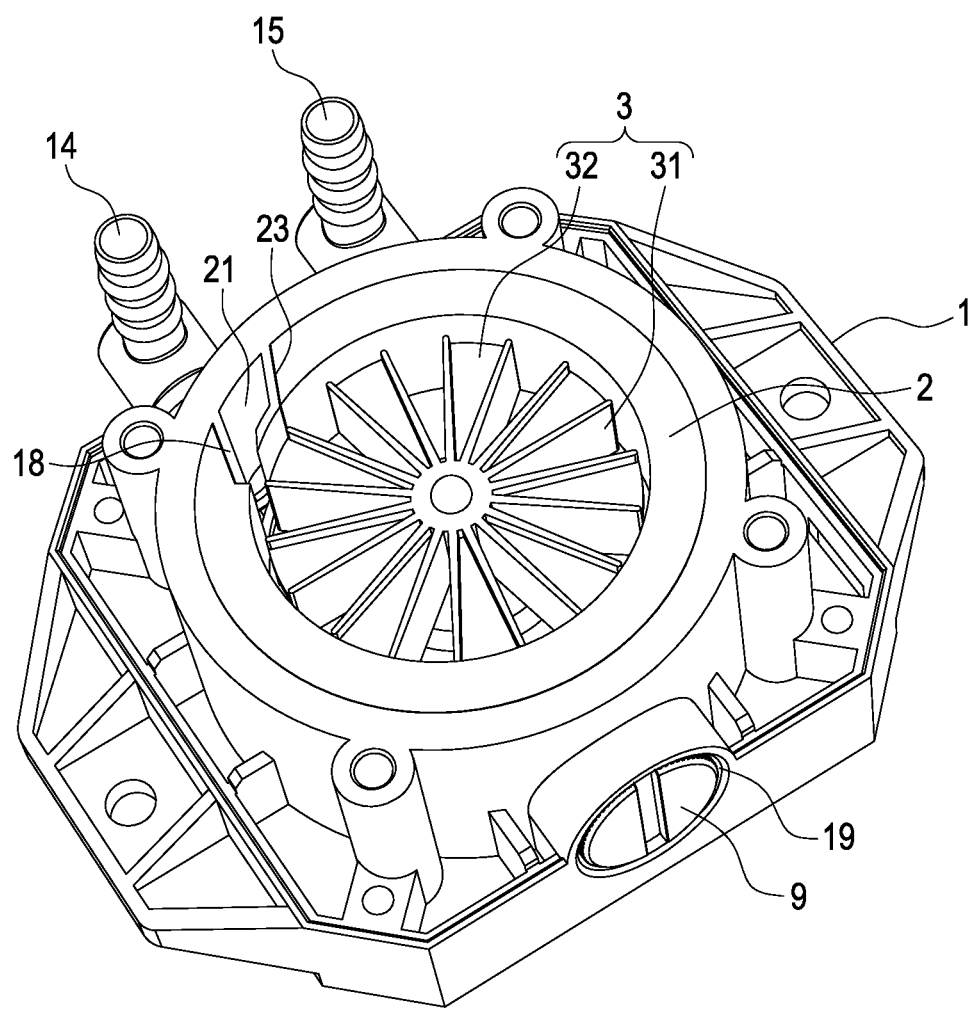
FIG. 4 is a partially assembled view of the water-cooled heat dissipating device of the invention.
Figure 5:
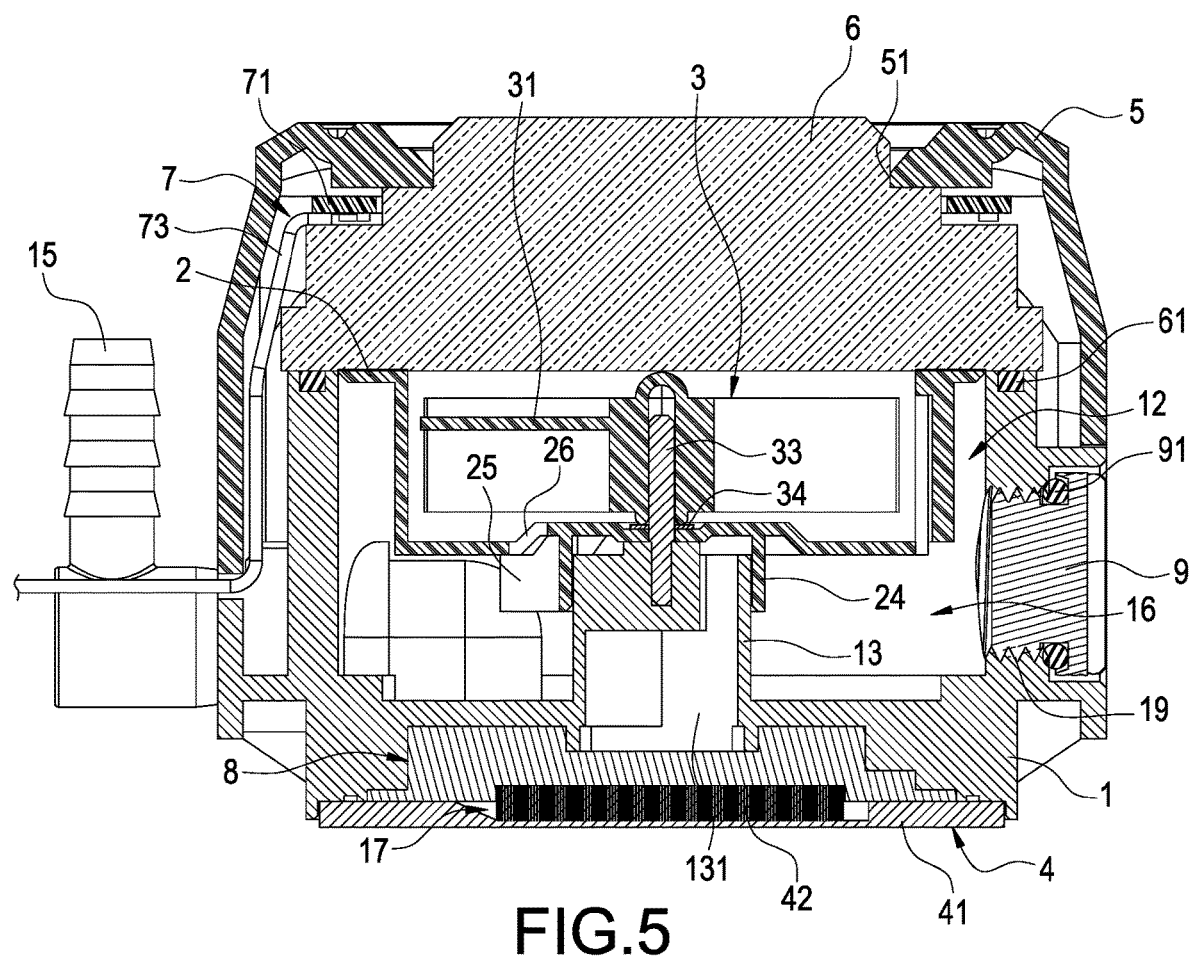
FIG. 5 is a cross-sectional view of the water-cooled heat dissipating device of the invention.
Figure 6:
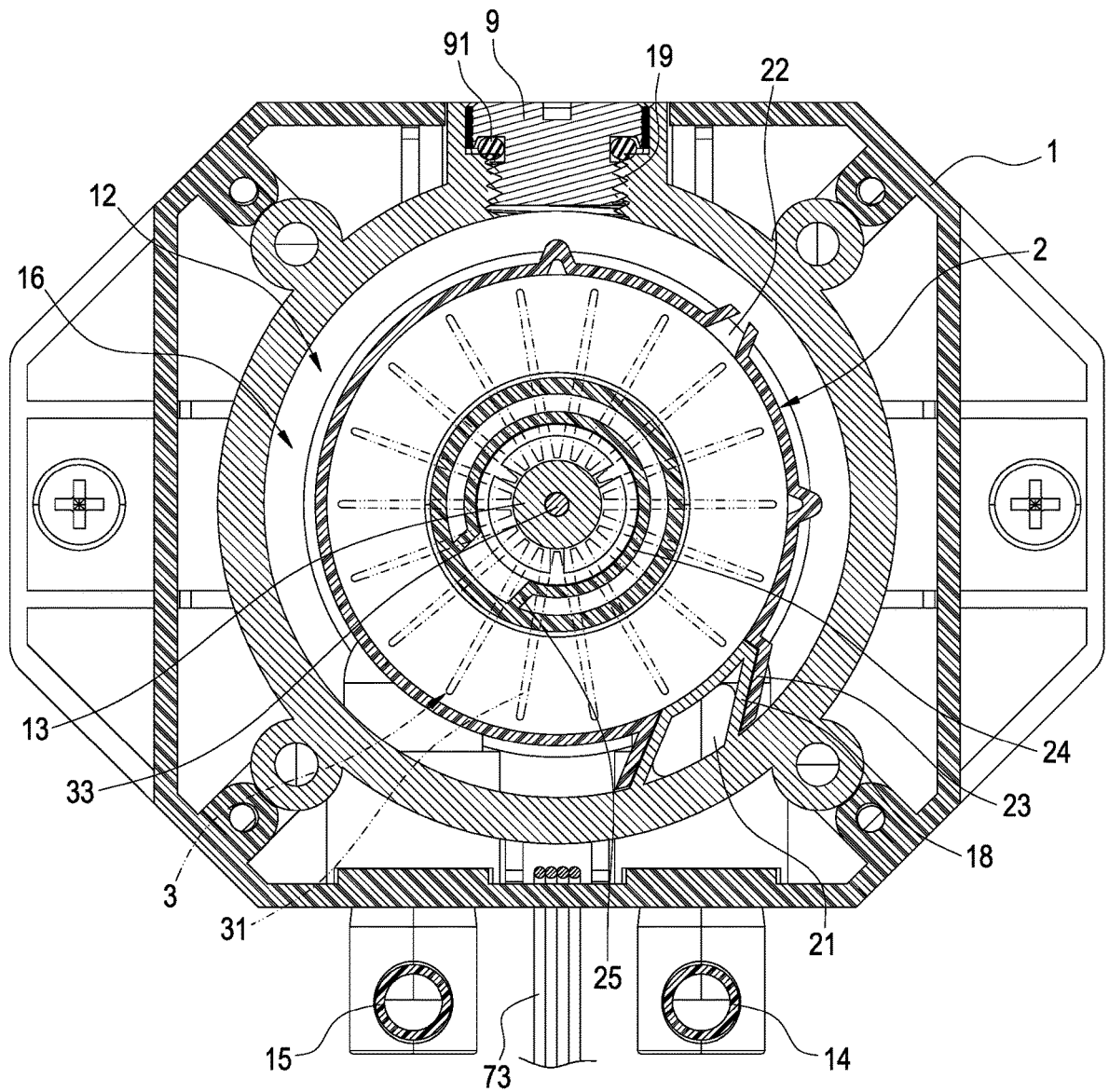
FIG. 6 is another cross-sectional view of the water-cooled heat dissipating device of the invention.

As shown in FIGS. 1, 2 and 5, the catchment tank 2 has two first slant plates 23 corresponding to the water intake 21. Each first slant plate 23 aslant connects to a wall of the catchment tank 2. The base 1 has two second slant plates 18 separately corresponding to the first slant plates 23 so as to make the catchment tank 2 positioned in the chamber 12 of the base 1. As shown in FIG. 1, the water intake 21 and the water outtake 22 are separately formed on the wall of the catchment tank 2.

The catchment tank 2 further has 1 sleeve 24 and two guiding plates 25 connected to the sleeve 24. The sleeve 24 coaxially connects to the flow guiding pole 13. The guiding plates 25 can guide the working fluid to flow from the catchment portion 16 to a hollow 131 of the flow guiding pole 13, then into the heat exchanging portion 17 and finally out of the water outlet 15. Such a circulation can rapidly bring out heat from the heating element on which the cold plate 4 is attached. The catchment tank 2 is formed with a through hole 26 between the guiding plates 25 to increase discharge of the working fluid from top to bottom.

The passive impeller 3 is received in the catchment tank 2 and radially driven to rotate against the catchment tank 2 by the working fluid. In detail, the passive impeller 3 further includes blades 31 which are radially arranged, blocking plates 32 separately connected between adjacent two of the blades 31 at regular intervals and a shaft 33 rotatably connected to the flow guiding pole 13. A washer 34 is disposed between the shaft 33 and the flow guiding pole 13. When the working fluid flows into the catchment tank 2 through the water inlet 14, the water flow drives the passive impeller 3 in a direction perpendicular to each blade 31 (i.e. a radial direction) to rotate about the shaft 33. Because of the arrangement of both the first slant plates 23 and the blocking plates 32, the passive impeller 3 can be easily driven to rotate by a small flow force. In other words, the passive impeller 3 does not tend to stop.

The cold plate 4 is arranged correspondingly to the heat exchanging portion 17 and fastened to the base 1. In this embodiment, the cold plate 4 includes a substrate 41 and fins 42 mounted thereon. The fins 42 are arranged correspondingly to the heat exchanging portion 17. When the working fluid is driven by a pump (not shown) to flow, the working fluid flows into the catchment tank 2 through the water inlet 14 to rotate the passive impeller 3 and flows from the water outtake 22 to the heat exchanging portion 17 through the catchment portion 16, the guiding plates 25 and the flow guiding pole 13.

To make the working fluid to rapidly bring heat from the heating element out of the cold plate 4, a water separating seat 8 is disposed on the base 1 as shown in FIGS. 1, 2 and 5. A top side 81 of the water separating seat 8 is in contact with the division plate 11 and located in the heat exchanging portion 17. The water separating seat 8 is formed with an inlet hole 82 and an outlet hole 83 discrete from the inlet hole 82. The inlet hole 82 and the outlet hole 83 are arranged correspondingly to the flow guiding pole 13 and the water outlet 15, respectively, so that the working fluid can be introduced into the heat exchanging portion 17 to make heat exchange in a specific direction and then be ejected from the water outlet 15. In other words, the working fluid can flow into the heat exchanging portion 17 through the inlet hole 82, pass through the fins 42 of the cold plate 4 and the outlet hole 83 and then flow out from the water outlet 15.

The lighting module 7 includes an LED (light emitting diode) strip light 71, a connector 72 and a wire set 73 connected between the LED strip light 71 and the connector 72. Both the connector 72 and part of the wire set 73 pass through the base 1 to electrically connect to a main board (not shown) for lighting the LED strip light 71, and the light from the LED strip light 71 is reflected/diffused by the transparent cover plate 6.

Besides, the embodiment further includes a fastener 9 such as a screw and a water-resistant washer 91 associated with the fastener 9. The base 1 is provide with a water filling hole 19 communicating with the chamber 12. When a user is aware of stopping rotating of the passive impeller 3, he or she can timely supplement the working fluid to avoid damage of the heating element. In other words, when the working fluid lacks because of leakage or other causes, all a user needs to do is to remove the fastener 9 from the water filling hole 19 to supplement the working fluid. After supplementing, screwing the fastener 9 to the water filling hole 19 can restore the heat dissipating effect of the water-cooled heat dissipating device of the invention.

The embodiment reduces volume of the chamber 12 by the catchment tank 2, so the passive impeller 3 is easier to be driven. It is advantageous to monitoring the level of the working fluid and timely supplementing the working fluid.

It will be appreciated by persons skilled in the art that the above embodiment has been described by way of example only and not in any limitative sense, and that various alterations and modifications are possible without departure from the scope of the disclosed example as defined by the appended claims.

What is claimed is:

1. A water-cooled heat dissipating device for conveying a working fluid, comprising:
    a base (1), comprising a division plate (11), a chamber (12), a flow guiding pole (13) vertically connected to the division plate (11) and projecting from the chamber (12), and both a water inlet (14) and a water outlet (15), which connect to a side of the base (1), the division plate (11) dividing the chamber (12) into a catchment portion (16) and a heat exchanging portion (17), and the flow guiding pole (13) communicating with both the catchment portion and the heat exchanging portion (17);
    a passive impeller (3) received in the chamber (12) and radially driven to rotate by the working fluid;
    a cold plate (4), arranged correspondingly to the heat exchanging portion (17), and fastened to the base (1); and
    a top cover (5) assembled on the base (1), a transparent cover plate (6) disposed between the base (1) and the top cover (5) and a lighting module (7) disposed between the top cover (5) and the transparent cover plate (6), wherein the top cover (6) is formed with a concave opening (51) for exposing the transparent cover plate (6),
    wherein the lighting module (7) comprises an LED (light emitting diode) strip light (71), a connector (72) and a wire set (73) connected between the LED strip light (71) and the connector (72), and both the connector (72) and part of the wire set (73) pass through the base (1).

2. The water-cooled heat dissipating device of claim 1, further comprising a catchment tank (2) received in the chamber (12) and fixed on the flow guiding pole (13), wherein the catchment tank (2) is formed with both a water intake (21) corresponding to the water inlet (14) and a water outtake (22) communicating with the catchment portion (16).

3. The water-cooled heat dissipating device of claim 2, wherein the catchment tank (2) has two first slant plates (23) corresponding to the water intake (21), each first slant plate (23) aslant connects to a wall of the catchment tank (2), and the base (1) has two second slant plates (18) separately corresponding to the first slant plates (23).

4. The water-cooled heat dissipating device of claim 2, wherein the catchment tank (2) further comprises a sleeve (24) and two guiding plates (25) connected to the sleeve (24), the sleeve (24) coaxially connects to the flow guiding pole (13), and the guiding plates (25) guides the working fluid to flow from the catchment portion (16) into the flow guiding pole (13) and then into the heat exchanging portion (17).

5. The water-cooled heat dissipating device of claim 4, wherein the catchment tank (2) is formed with a through hole (26) between the guiding plates (25).

6. The water-cooled heat dissipating device of claim 1, wherein the passive impeller (3) further comprises blades

(31) which are radially arranged and blocking plates (32) separately connected between adjacent two of the blades (31) at regular intervals.

7. The water-cooled heat dissipating device of claim 1, wherein the cold plate (4) comprises a substrate (41) and fins (42) mounted thereon, and the fins (42) are arranged correspondingly to the heat exchanging portion (17).

8. The water-cooled heat dissipating device of claim 1, further comprising a fastener, wherein the base (1) is provide with a water filling hole (19) communicating with the chamber (12), and the fastener (9) removably closes the water filling hole (19) for supplementing the working fluid.

9. A water-cooled heat dissipating device for conveying a working fluid, comprising:
- a base (1), comprising a division plate (11), a chamber (12), a flow guiding pole (13) vertically connected to the division plate (11) and projecting from the chamber (12), and both a water inlet (14) and a water outlet (15), which connect to a side of the base (1), the division plate (11) dividing the chamber (12) into a catchment portion (16) and a heat exchanging portion (17), and the flow guiding pole (13) communicating with both the catchment portion and the heat exchanging portion (17);
- a passive impeller (3) received in the chamber (12) and radially driven to rotate by the working fluid;
- a cold plate (4), arranged correspondingly to the heat exchanging portion (17), and fastened to the base (1); and
- a water separating seat (8) mounted on the base (1), wherein a top side (81) of the water separating seat (8) is in contact with the division plate (11) and located in the heat exchanging portion (17), and the water separating seat (8) is formed with an inlet hole (82) and an outlet hole (83) discrete from the inlet hole (82).

10. The water-cooled heat dissipating device of claim 9, wherein the inlet hole (82) and the outlet hole (83) are arranged correspondingly to the flow guiding pole 13 and the water outlet 15, respectively, and the working fluid flows into the heat exchanging portion (17) through the inlet hole (82), passes through the cold plate (4) and the outlet hole (83) and then flows out from the water outlet (15).

\* \* \* \* \*